United States Patent
Ohtani

(10) Patent No.: US 6,734,494 B2
(45) Date of Patent: May 11, 2004

(54) VERTICAL FIELD EFFECT TRANSISTOR

(75) Inventor: Kinya Ohtani, Kawasaki (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 10/445,502

(22) Filed: May 27, 2003

(65) Prior Publication Data

US 2003/0222304 A1 Dec. 4, 2003

(30) Foreign Application Priority Data

May 29, 2002 (JP) ..................... 2002-155246

(51) Int. Cl.$^7$ .............................. H01L 29/76
(52) U.S. Cl. ............... 257/330; 257/263; 257/331; 257/332; 257/333; 257/334
(58) Field of Search ................. 257/330, 331, 257/263, 332, 333, 334

(56) References Cited

U.S. PATENT DOCUMENTS 5,072,266 A  12/1991  Bulucea et al. ............ 357/23.4

FOREIGN PATENT DOCUMENTS

JP  08-167711  6/1996  ........... H01L/29/78

Primary Examiner—Eddie Lee
Assistant Examiner—Thomas Magee
(74) Attorney, Agent, or Firm—Hayes Soloway P.C.

(57) ABSTRACT

A vertical field effect transistor includes an $N^+$ semiconductor substrate and an $N^-$ epitaxial layer deposited thereon and having lower dopant concentration than the semiconductor substrate, and is configured to have a plurality of unit cell transistors formed in the $N^-$ epitaxial layer and arranged in the epitaxial layer in longitudinal and lateral directions. The unit cell transistor includes a trench formed to have a depth $X_a$ and a width $W$, and further a gate electrode 25 formed within the trench and interposing a gate insulating film that has a thickness $T_{OX}$ and formed between the gate electrode and the surface of the trench. Moreover, the unit cell transistor includes a P-type base region having a depth $X_b$, a source region, a heavily doped P-type base region formed in a central portion of the cell transistor and having a depth $X_c$, and an gate insulating film (in this case, gate oxide film) formed facing the surface of the trench, in which those components are formed so as to satisfy mathematical relationships represented by $X_b < X_a$ and $X_a \approx X_c$. The unit cell transistor is further constructed such that when assuming spacing between the trench and the heavily doped P-type region is $L_{td}$, the trench and the heavily doped P-type region are formed so as to satisfy a mathematical relationship represented by $L_{td} \leq 2 \times (X_a - X_b)$.

6 Claims, 7 Drawing Sheets

-------- EQUIPOTENTIAL LINE

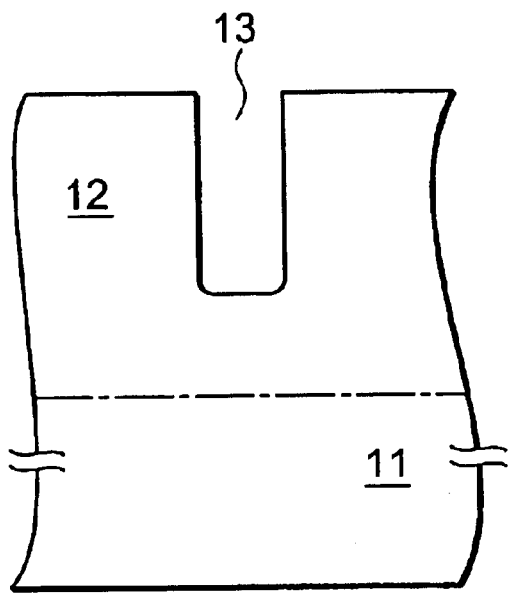
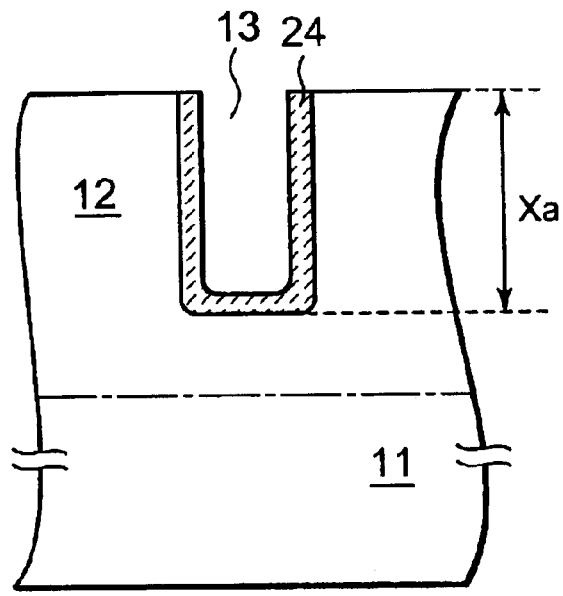
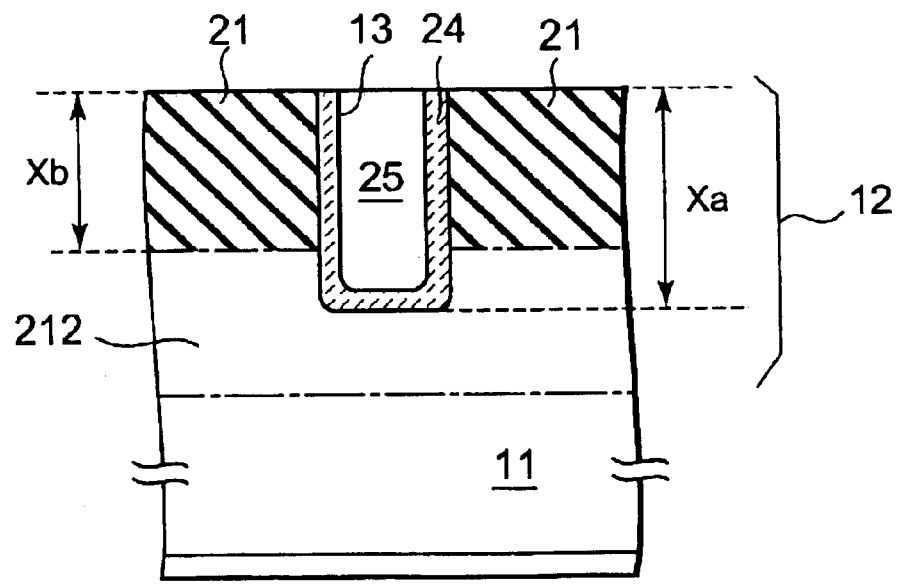

------- EQUIPOTENTIAL LINE

VERTICAL FIELD EFFECT TRANSISTOR

BACKGROUND OF THE INVENTION

1. Field of the Invention The present invention relates to a vertical field effect transistor provided with a trench-gate structure and having a current path along the sidewall of trench in a direction of thickness of substrate.

2. Description of the Related Art

Conventionally, a field effect transistor (hereinafter, referred to as MOS transistor) has been employed as one of power devices designed to withstand relatively high current densities and the application of relatively high voltages. Since the MOS transistor is the device of the type used to control its operation by means of voltage, it is advantageously able to operate without need for current input to the transistor to control its operation. Furthermore, the MOS transistor operates utilizing the lateral flow of carriers as a majority carrier that is the only one selected from an electron and a hole. On the other hand, a bipolar transistor operates utilizing the flow of the minority carriers in a vertical direction. Moreover, the bipolar transistor is forced to operate at lower speed when minority carriers accumulates within a base formed extremely thin in a vertical direction. The MOS transistor never suffers from the aforementioned undesirable accumulation of carriers. Accordingly, the MOS transistor is able to switch its state between ON and OFF at high speed. Furthermore, since the MOS transistor has a source and a drain spaced from each other by a distance longer compared with the length of base of bipolar transistor, the MOS transistor operates in a punch-through mode less potentially than the bipolar transistor. Therefore, the MOS transistor has frequently been employed as an inductive load such as a switching regulator.

The first a MOS transistor which became commercially availablewas of the type that allows operation current (drain current) to flow in a direction (lateral direction) parallel to the principal surface of a semiconductor substrate. In contrast, recently, a vertical MOS transistor has been widely used which allows drain current to flow in a direction (vertical direction) vertical to the principal surface of a semiconductor substrate. The vertical MOS transistor can advantageously increase its current capacity because the transistor can be designed to arrange a number of unit cells as a unit element in parallel with one another, constituting a MOS transistor.

For a power device designed to withstand high current densities and the application of high voltages, the on-state series resistance (hereinafter, referred to as on-resistance) and the off-state blocking voltage are important. Since the on-resistance largely affects the switching operation of the power device, the on-resistance is desirably made as small as possible. Furthermore, the off-state blocking voltage is desirably made as large as possible so as to enable the power device to withstand the application of high voltages. Therefore, for making the best of the aforementioned advantages, the vertical MOS transistor needs to reduce its on-resistance and to improve off-state blocking voltage.

FIG. 1 is a cross-sectional view of an example of a conventional vertical MOS transistor. As shown in FIG. 1, the vertical MOS transistor includes: an N.sup.+(heavily N-type doped) substrate 101; an N.sup.−(lightly N-type doped) layer 102, a P-type base layer 103; an N.sup.+source region 104; a trench 105; a gate insulating film 106; a gate electrode 107; an interlayer insulating film 108; a source electrode 109; a drain electrode 110; and a channel region 111. Furthermore, in the figure, L denotes spacing between trenches.

The vertical MOS transistor having the aforementioned configuration operates as follows. A specific drain voltage V.sub.DS is applied between the source electrode 109 and the drain electrode 110, and a specific gate voltage V.sub.GS is applied between the source electrode 109 and the gate electrode 107. Then, the channel region 111 of the P-type base layer 103 in the vicinity of the gate insulating film 106 is inverted to form an N-type region which is a channel that allows electric charges to flow therethrough. The inverted channel provides electrical connection between the source and drain of the transistor. At this point, the resistance between the source and drain is referred to as an on-resistance of the vertical MOS transistor.

Additionally, when the channel region between source and drain is being electrically conductive (in an on-state), the gate voltage V.sub.GS applied between the source electrode 109 and the gate electrode 107 is set to 0 volts or to a negative voltage, i.e., a reverse bias. This turns off the gate and turns the inverted channel region 111 back to a P-type region, turning an electrical path between source and drain to a nonconductive state (i.e., off-state). Thus, controlling the gate voltage V.sub.GS allows control of current flow between source and drain, and further allows the vertical MOS transistor to be employed as a power switch element.

The off-state blocking voltage BV.sub.DS of the vertical MOS transistor is defined as a drain voltage V.sub.GS that can be applied to the transistor whose gate is in an off-state. The voltage BV.sub.DS is generally determined by the dopant concentration and the thickness of the N.sup.−layer 102. However, in case of a vertical MOS transistor, the voltage BV.sub.DS further depends on how the surface region of the transistor is constructed. Particularly, in case of a vertical field effect transistor with a trench-gate structure, since the trench 105 penetrates the P-type base layer 103 and then protrudes into the N.sup.−layer 102, the blocking voltage BV.sub.DS of the transistor is determined by the distal end of the trench 105 protruding into the N.sup.−layer 102.

FIG. 2 is an electrical field contour plot showing simulated equipotential line distributions representing individual electric potentials of regions that range from the central portion of trench to the central portion of cell and are located around the distal end of trench in the vertical MOS transistor shown in FIG. 1. In this case, the conditions employed to determine the simulated equipotential line distributions are as follows. That is, dopant concentration of the N.sup.−layer 102 is 1 ohm-cm and total vertical thickness of the P-type base layer 103 and the N.sup.−layer 102 is 8.5 micrometers.

As can be seen from FIG. 2, when a drain voltage V.sub.DS is applied to the vertical MOS transistor, a depletion zone extends from the P-type base layer 103 to the N.sup.−layer 102. However, an equipotential line representing a higher potential below the boundary between the layers 103, 102 and located in the vicinity (denoted by "C" in FIG. 2) of the corner of the distal end of the trench 105 protruding into the N.sup.−layer 102 is pulled a little in a direction approaching the adjacent and lower potential line, increasing the strength of an electric field in the vicinity of the corner. Thus, the strength of an electric field in the vicinity of the corner determines the blocking voltage of transistor, voltage is lower than that of a transistor having no protrusion of the trench 105 into the N.sup.−layer 102.

To prevent lowering of the blocking voltage of a vertical MOS transistor having a trench-gate structure, for example, a vertical MOS transistor disclosed in U.S. Pat. No. 5,072, 266 is proposed. FIG. 3 is a perspective cross-sectiona lview of the vertical MOS transistor disclosed in U.S. Pat. No.

5,072,266. The vertical MOS transistor shown in FIG. 3 has a heavily doped P-type region provided in the central portion of a P-type base layer 103 and having a depth larger than that of a trench 105. The remaining configuration of the vertical MOS transistor shown in FIG. 3 is the same as that of the conventional vertical MOS transistor.

Additionally, Japanese Patent Application Laid-open No. 8(1996)-167711 discloses a vertical MOS transistor having a P.sup.-layer provided between a P-type base layer and an N.sup.-layer, in order to prevent lowering of the blocking voltage of the transistor while maintaining a low value of the on-resistance thereof. FIG. 4 is a cross-sectional view of the vertical MOS transistor disclosed in the aforementioned publication. The vertical MOS transistor disclosed in Japanese Patent Application Laid-open No. 8(1996)-167711 includes a P.sup.-layer 121 formed so that the P.sup.-layer 121 is located between a P-type base layer 103 and an N.sup.-layer 102 while contacting the P-type base layer 103, and disposed facing an insulating film 106 on the trench sidewall via the N.sup.-layer 102. The remaining configuration of the vertical MOS transistor is the same as that of the conventional vertical MOS transistor shown in FIG. 1.

In the above-described vertical MOS transistor having the configuration shown in FIG. 3, when a drain voltage V.sub.DS is applied to the transistor, a depletion zone extends from the P-type base layer 103 to the N.sup.-layer 102, as is already explained in the description of the conventional vertical MOS transistor shown in FIG. 1. In this case, since the heavily doped P-type region in the central portion of a P-type base layer 103 is formed deeper than the trench 105, the degree to which an equipotential line representing a higher potential below the boundary between the layers 103, 102 and located in the vicinity of the corner of the distal end of the trench 105 is pulled in a direction approaching the adjacent and lower potential line is reduced, reducing the degree to which the blocking voltage of the transistor determined by the strength of an electric field in the vicinity of the corner of the distal end of the trench 105 is reduced. However, an equipotential line representing a higher potential located in the vicinity of the corner of the distal end of the heavily doped P-type region is pulled in a direction approaching the adjacent and lower potential line, increasing the strength of an electric field in the vicinity of the corner of the distal end of the heavily doped P-type region. Thus, the strength of an electric field in the vicinity of the corner determines the blocking voltage of transistor. Furthermore, when forming the heavily doped P-type region having a large depth, spread of a current path in the lateral direction is limited, undesirably increasing the on-resistance of the transistor.

Additionally, in case of the vertical MOS transistor, having the P.sup.-layer 121, of FIG. 4, when applying a drain voltage V.sub.DS to the transistor, a depletion zone also extends to the P.sup.-layer 121 and therefore, a decrease in the degree to which an equipotential line representing a higher potential and located in the vicinity of the corner of the distal end of the trench 105 is pulled in a direction approaching the adjacent and lower potential line is suppressed to a small extent. Accordingly, decrease in the strength of an electric field in the vicinity of the corner of the distal end of the trench 105 is suppressed to a small extent, limiting the increase in the blocking voltage BV.sub.DS of the transistor. Moreover, since avalanche breakdown occurring in an off state of the transistor easily generates carriers in the vicinity of the gate oxide film, the gate oxide film is susceptible to any damage due the carriers.

SUMMARY OF THE INVENTION

In consideration of aforementioned problems found in the conventional technique, the present invention has been conceived and therefore, is directed to a vertical MOS transistor having ability to increase its blocking voltage BV.sub.DS and constructed in a simple manner while preventing the on-resistance of the transistor from increasing and damage due to carriers generated upon avalanche breakdown of the transistor from being imposed on a gate oxide film.

A vertical MOS transistor according to the present invention includes a drain region consisting of a semiconductor layer of a first conductivity type; a base region of a second conductivity type formed on the drain region and located adjacent the drain region; a source region of a first conductivity type located within the base region and formed in a surface portion of the base region; a trench penetrating the base region and the source region to reach a part of the drain region, and extending in longitudinal and lateral directions in order to divide the base region and the source region in longitudinal and lateral directions into individual base regions and individual source regions; a gate insulating film formed on a surface of the trench; a gate electrode formed within the trench while interposing the gate insulating film between the gate electrode and the surface of the trench; a base contact region located at a approximately central portion of a region surrounded by the trench and apart from the source region, and formed deeper the base region, and further, having a higher dopant concentration than the base region. The transistor is further constructed such that when assuming a distance between a bottom and a top of the trench in a depth direction of the trench, a distance between a bottom and a top of the base region in a depth direction of the base region, and a distance between a bottom and a top of the base contact region in a depth direction of the base contact region are X.sub.a, X.sub.b and X.sub.c, respectively, the trench, the base region and the base contact region are formed so as to satisfy following mathematical relationships.

X.sub.b<X.sub.a

*X.sub.b<X.sub.c<(2.times.X.sub.a–X.sub.b)*

The vertical MOS transistor of the present invention is further constructed such that when assuming that the depth of the base contact region X.sub.c is equal to that of the trench X.sub.a, and that spacing between the trench and the base contact region is L.sub.td, the trench and the base contact region is L.sub.td are formed so as to satisfy a following mathematical relationship.

*L.sub.td≦2.times.(X.sub.a–X.sub.b)*

BRIEF DESCRIPTION OF THE DRAWINGS

FIG. 6A is a sectional view of the vertical MOS transistor shown in FIGS. 5A, 5B, illustrating a primary process step in the order of process steps in the manufacturing method;

FIG. 6B is a sectional view of a subsequent step related to FIG. 6A;

FIG. 6C is a sectional view of a subsequent step related to FIG. 6B;

DETAILED DESCRIPTION OF THE PREFERRED EMBODIMENTS

A preferred embodiment of the present invention will be explained with reference to the accompanying drawings.

Figure 5A:
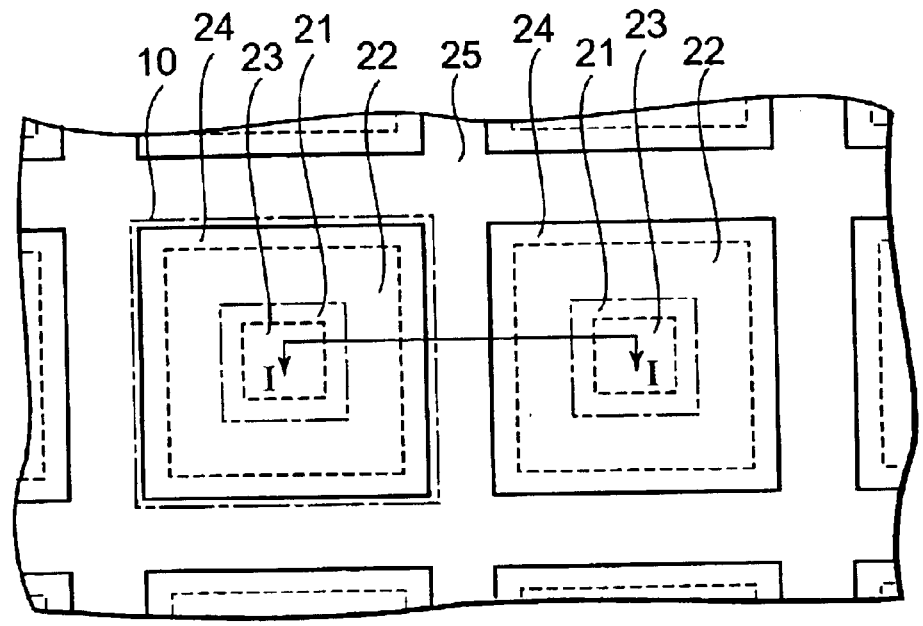
FIG. 5A is a schematic partial plan view of a vertical MOS transistor according to an embodiment of the present invention.
Figure 5B:
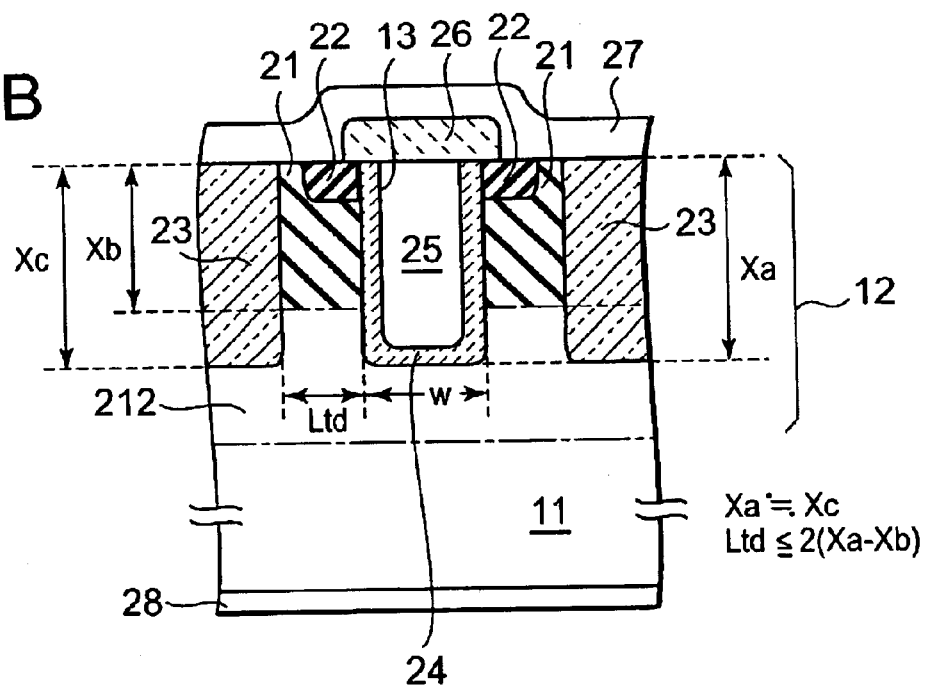
FIG. 5B is a cross-sectional view taken along the line I—I of FIG. 5A.
Figure 7A:
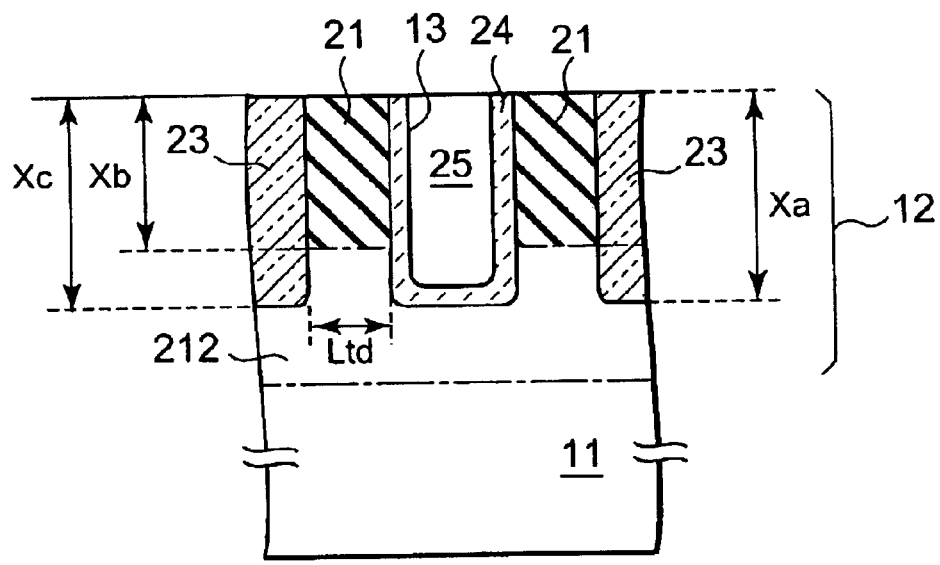
FIG. 7A is a sectional view of a subsequent step related to FIG. 6C.
Figure 7B:
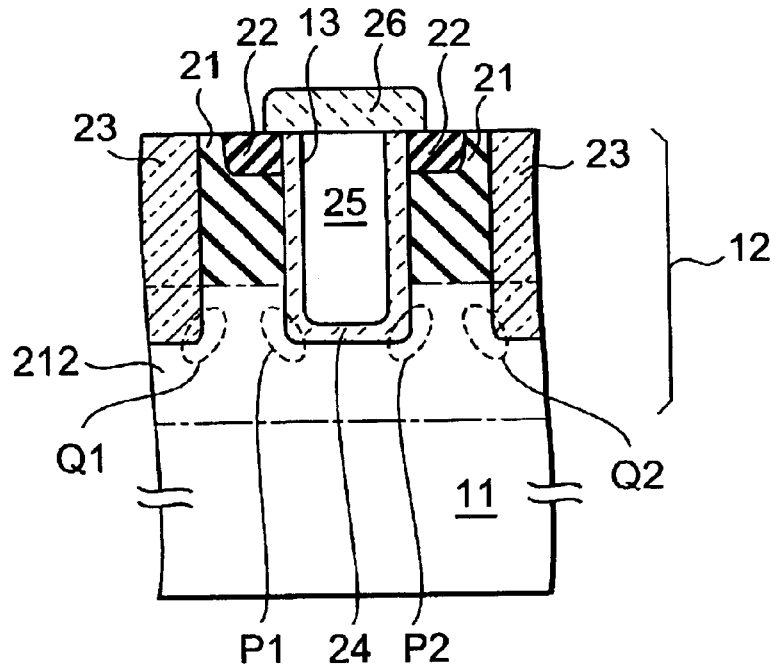
FIG. 7B is a sectional view of a subsequent step related to FIG. 7A.

FIGS. 5A and 5B are diagrams illustrating a vertical MOS transistor according to an embodiment of the present invention when a first conductivity type and a second conductivity type are defined as N-type and P-type, respectively, and FIG. 5A is a schematic partial plan view of the transistor, and FIG. 5B is a cross-sectional view taken along the line I—I of FIG. 5A. Note that FIG. 5A does not depict an interlayer insulation film 26 and a source electrode 27 shown in FIG. 5B for simplification. Referring to FIG. 5A, a vertical MOS transistor of the embodiment is constructed by arranging a plurality of rectangular unit cell transistors 10 in a periodic fashion. The individual cell transistor 10 is formed within an $N^-$-epitaxial layer 12 (low doped semiconductor layer) that is deposited on an $N^+$-semiconductor substrate (heavily doped semiconductor substrate) 11 and has a resistivity value, lower than that of the semiconductor substrate 11, of 1 to 20 ohm-cm and a thickness of 5 to 60 micrometers. The semiconductor substrate 11 and the epitaxial layer 12 constitute an N-type semiconductor layer that is also referred to as a drain region A trench 13 having a depth Xa and a width W is formed at the periphery of the individual cell transistor 10 and a gate electrode 25 made from a polysilicon film is formed within the trench 13 via a gate oxide film 24 having a film thickness $t_{OX}$. The individual cell transistor 10 includes: a P-type base region 21 as a first P-type semiconductor region formed by implanting P-type dopants into the epitaxial layer 12 and having a depth $X_b$; a source region 22 as an N-type region by implanting N-type dopants into the epitaxial layer 12; a heavily doped P-type region 23 as a second P-type region providing electrical contact to the P-type base region 21 and formed in the central portion of the individual cell transistor 10; and a gate insulating film 24 formed on the wall of the trench 13. Note that the depth $X_b$ of the P-type base region 21 does not exceed the depth $X_a$ of the trench 13 and the aforementioned two depths have the following mathematical relationship.

$$X_b < X_a \qquad (1)$$

Furthermore, the depth $X_c$ of the heavily doped P-type region 23 is approximately equal to the depth $X_a$ (more strictly, the depth of a boundary between the gate insulating film 24 located at the bottom of the trench 13 and an $N^-$-region 212) of the trench 13 and the aforementioned two depths have the following mathematical relationship.

$$X_a \approx X_b \qquad (2)$$

Additionally, assuming that minimum spacing between the trench 13 and the heavily doped P-type region 23 is $L_{td}$, those two components are formed so as to satisfy the following mathematical relationship.

$$L_{td} \leq 2 \times (X_a - X_b) \qquad (3)$$

Moreover, an interlayer insulation film 26 having a specific thickness is formed so as to cover the trench 13, the gate electrode 25 and a part of the $N^+$-source region 22, and a source electrode 27 made of aluminum, etc., is formed so as to cover the interlayer insulation film 26, the heavily doped P-type region 23 and an exposed portion of the $N^+$-source region 22. Furthermore, a drain electrode 28 made of gold, silver, nickel, etc., is formed on the $N^+$-semiconductor substrate 11.

A method for manufacturing the vertical MOS transistor of the embodiment will be explained below with reference to a detailed example. FIGS. 6A, 6B, 6C and FIGS. 7A, 7B are sectional views of the vertical MOS transistor, each illustrating a primary process step in the manufacturing method. The method will be explained with reference to FIGS. 6A, 6B, 6C and FIGS. 7A, 7B.

First, an $N^-$-epitaxial layer 12 is formed on an $N^+$-silicon substrate 11 and a silicon oxide film (not shown) is formed on the epitaxial layer to have a thickness of about 1 micrometers. Then, using photolithography and dry etching techniques, a trench 13 having a depth of about 1.0 micrometers and a width of about 0.5 micrometers is formed in the silicon substrate to extend repeatedly in horizontal and vertical (in other words, longitudinal and lateral) directions (refer to FIG. 6A). Thereafter, using thermal oxidation, a gate oxide film 24 having a thickness of about 50 nanometers is formed on the inner wall of the trench (refer to FIG. 6B).

Subsequently, a polysilicon is deposited over the entire surface of the substrate and the polysilicon is doped with phosphorous to form a low resistance polysilicon. Then, using etch back or chemical mechanical polishing (CMP) techniques, the polysilicon and the silicon oxide film on the substrate are removed to form the polisilicon within the trench 13, thereby forming a gate electrode 25. Thereafter, boron (B) is implanted into the substrate at a dose of $1 \times 10^{13}$ cm$^{-2}$ and an energy of 70 KeV, and then, the substrate is heated at a temperature of 1000.degree. C. for about 10 minutes to form a P-type base region 21 (refer to FIG. 6C).

Using a photolithography technique, a resist mask is formed on the surface of the substrate and boron is implanted into the central portion of the cell at a dose of $1 \times 10^{15}$ cm$^{-2}$ and an energy of 150 KeV, and then, the substrate is heated at a temperature of 1100.degree. C. for about 30 minutes to form a heavily doped P-type region 23 (refer to FIG. 7A).

Using a photolithography technique, a resist mask is formed on the surface of the substrate and arsenic (As) is implanted into the substrate at a dose of $1 \times 10^{16}$ cm$^{-2}$ and an energy of 70 KeV, and then, the substrate is heated at a temperature of 1000°C. for about 30 minutes to form an N+ source region 22. Then, using hemical-Vapor-Deposition (CVD), a silicon oxide film is deposited on the surface of the substrate to a thickness of about 1.0 micrometers and is patterned by photolithography and dry etching to form an interlayer insulation film 26 that covers the gate electrode 25 and a part of each of the N+ source regions 22 and forms a two dimensional grid pattern (refer to FIGS. 5B, 7B).

An aluminum film is deposited to a thickness of 4.5 micrometers by sputtering over the entire surfaces of the silicon substrate and the interlayer insulation film 26 to form a source electrode 27 and further is deposited on a rear surface of the substrate to form a drain electrode 28, completing formation of the vertical MOS transistor 1 shown in FIG. 5B.

How the vertical MOS transistor 1 operates will be explained below. First, the operation of the on-state transistor is explained.

When a positive voltage as a control voltage larger than a threshold voltage is applied between the gate electrode 25 and the source electrode 27, a side portion, contacting the gate insulating film 24 located adjacent the gate electrode 25, of the P-type base region 21 is inverted to an N-type region to form a channel region. Accordingly, drain current flows from the N+ semiconductor substrate 11 through the N− region 212 of the epitaxial layer 12 and the channel region to the N+ source region 22, turning the vertical MOS transistor 1 to an on-state.

Figure 1:
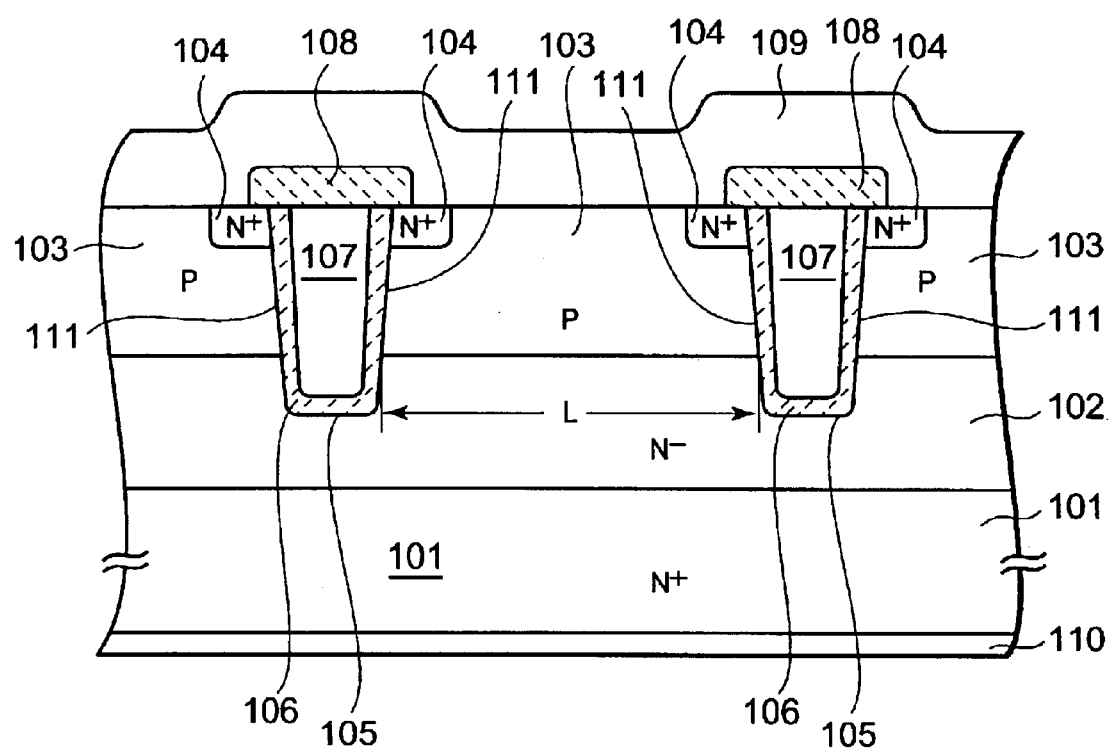
FIG. 1 is a cross-sectional view of an example of a conventional vertical MOS transistor.
Figure 2:
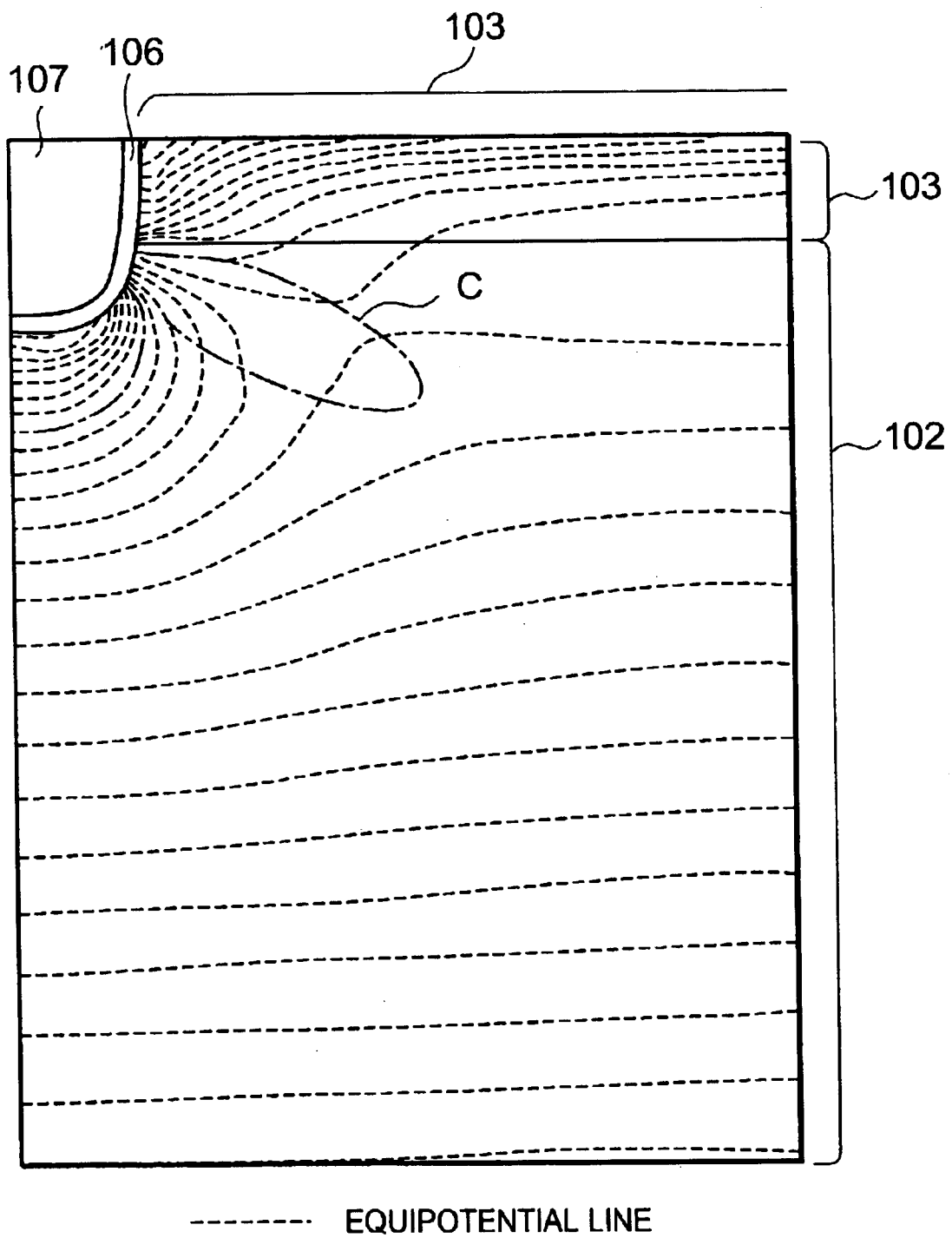
FIG. 2 is an electrical field contour plot showing simulated equipotential line distributions representing individual potentials of regions that range from the central portion of a trench to the central portion of a cell and are located around the distal end of the trench in the vertical MOS transistor shown in FIG. 1.
Figure 3:
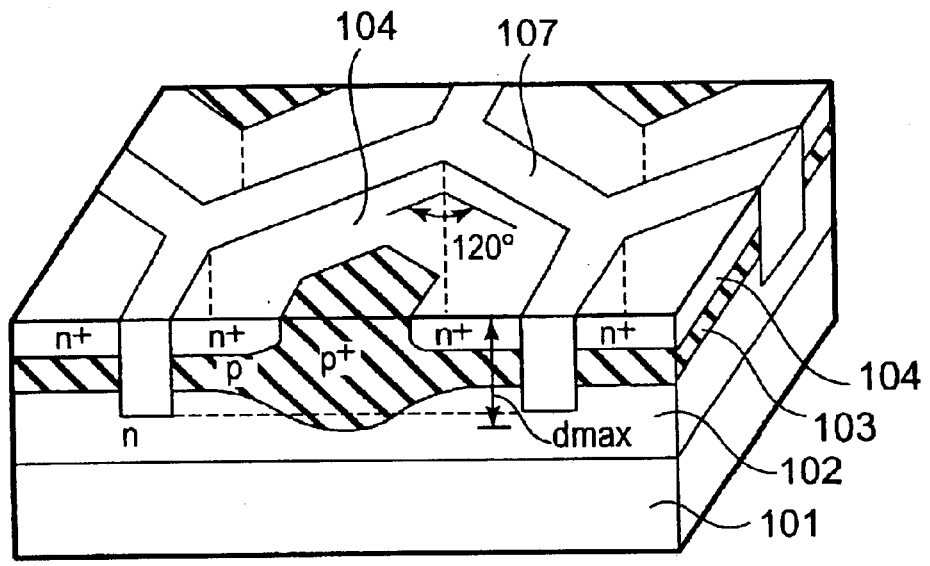
FIG. 3 is a perspective cross-sectional view of the vertical MOS transistor disclosed in U.S. Pat. No. 5,072,266.
Figure 4:
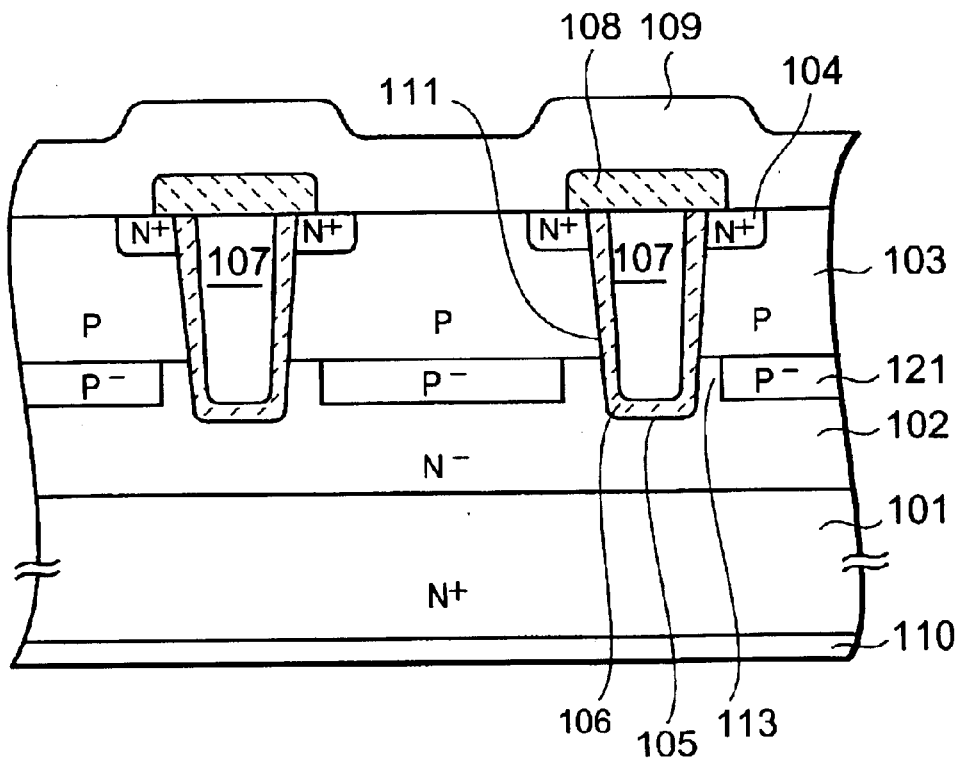
FIG. 4 is a cross-sectional view of the vertical MOS transistor disclosed in Japanese Patent Application Laid-open No. 8(1996)-167711.
Figure 8:
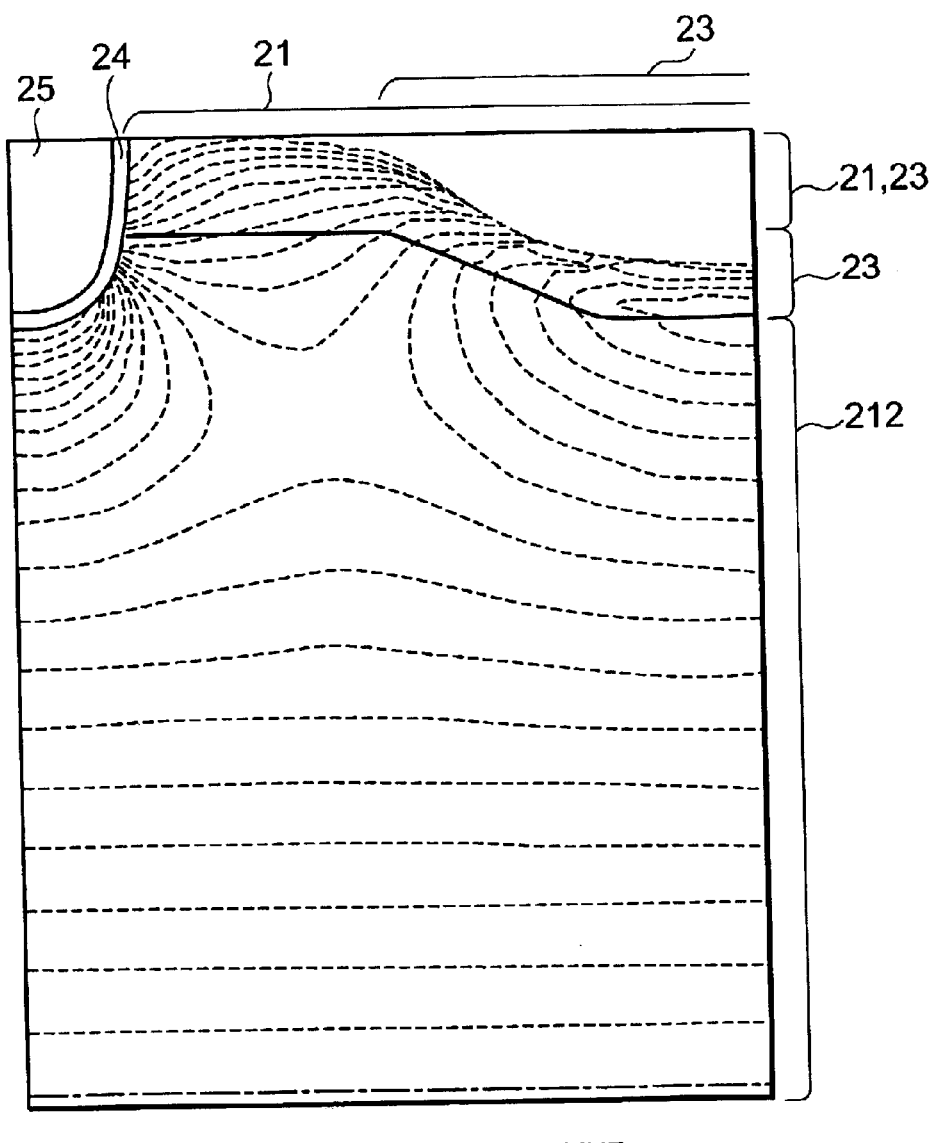
FIG. 8 is an electrical field contour plot showing simulated equipotential line distributions representing individual potentials of regions that range from the central portion of a trench to the central portion of a cell and are located around the distal end of the trench in the vertical MOS transistor shown in FIG. 5B.

Second, the operation of the off-state transistor is explained. FIG. 8 is an electrical field contour plot showing simulated equipotential line distributions representing individual potentials of regions that range from the central portion of a trench to the central portion of a cell and are located around the distal end of the trench in the vertical MOS transistor 1 when setting the potentials of the gate electrode 25 and the source electrode 27 to zero level and applying a positive voltage $V_{DS}$ to the drain electrode 28. In this case, the conditions employed to determine the simulated equipotential line distributions are as follows. That is, dopant concentration of the N−-layer 212 is 1 ohm-cm and total vertical thickness of the P-type base region 23 and the N−-layer 212 is 8.5 micrometers, which is the same configuration as that explained in the description of FIG. 2. When comparing the equipotential line distributions of FIG. 8 with those of FIG. 2 that are observed when employing the conventional vertical MOS transistor, it becomes clear that in the vertical MOS transistor 1 of the embodiment, the degree to which an equipotential line representing a higher potential below the boundary between the layers 23, 212 and located in the vicinity of the corner of the distal end of the trench 25 is pulled in a direction approaching the adjacent and lower potential line is largely reduced, resulting in increased flattening of equipotential line as compared to that denoted by C in FIG. 2. Therefore, the blocking voltage $BV_{DS}$ of the vertical MOS transistor 1 becomes nearly equal to that observed when the trench 13 does not protrude into the N−-region 212.

As described so far, the vertical MOS transistor 1 of the embodiment is characterized by the following features comprising:

(A) The trench 13 is formed deeper than a boundary between the P-type base region 21 and the N−-region 212 to reduce the on-resistance of the transistor;

(B) A distance between the heavily doped P-type region 23 formed in the central portion of the individual cell 10 and the trench 13 is made to have the aforementioned mathematical relationship represented by (3).

The above-stated configuration of the transistor reduces the degree to which an equipotential line representing a higher potential below the boundary between the layers 23, 212 and located in the vicinity of the corners (denoted by P1, P2 and Q1, Q2 in FIG. 7B) of the bottom surfaces of the trench 13 and the heavily doped P-type region 23 is pulled in a direction approaching the adjacent and lower potential line when the vertical MOS transistor 1 is in an off-state, allowing the transistor to increase its $BV_{DS}$.

It should be appreciated that the invention is not limited to the above-described embodiment, but may be modified without departing from the spirit and scope of the invention. For instance, although the above-described embodiment is explained by defining a first conductivity type and a second conductivity type respectively as N-type and P-type, the embodiment may be explained including a P-channel MOS transistor by defining a first conductivity type and a second conductivity type respectively as P-type and N-type. Furthermore, the geometrical shape of the unit cell 10 is not limited to a rectangle, but may be a strip, polygon, circle or the like.

Figure 9:
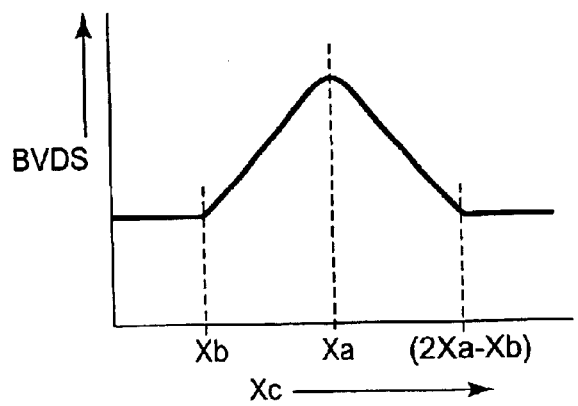
FIG. 9 is a graph illustrating how simulated $BV_{DS}$ of the vertical MOS transistor shown in FIG. 5B changes with the depth $X_c$ of the heavily doped P-type region while assuming the depth $X_a$ of the trench 13 is unchanged and when plotting $BV_{DS}$ and $X_c$ on the axis of ordinate and the axis of abscissas, respectively.

Furthermore, FIG. 9 is a graph illustrating how simulated $BV_{DS}$ of the vertical MOS transistor 1 changes with the depth $X_c$ of the heavily doped P-type region 23 while assuming the depth $X_a$ of the trench 13 is unchanged. In this case, $BV_{DS}$ and $X_c$ are plotted on the axis of ordinate and the axis of abscissas, respectively. As can be seen from FIG. 9, although in the embodiment, the vertical MOS transistor 1 is configured to include the heavily doped P-type region 23 having the depth $X_c$ that is approximately equal to the depth $X_a$ of the trench 13, the transistor may be configured to include the aforementioned components so that the components are formed so as to satisfy the following mathematical relationship, increasing the $BV_{DS}$ of the transistor to greater or lesser degrees.

$$X_b < X_c < (2 \times X_a - X_b) \quad (4)$$

Furthermore, when $X_a$ is defined as shown in FIG. 5B, it is desirable to form associated components so that $(X_a - t_{OX})$ becomes deeper by about 50 nm than $X_b$. This dimensional relationship therebetween ensures that when the vertical MOS transistor 1 turns on, a channel is formed in the P-type base region 21, preventing an increase in the on-resistance of the transistor.

It should be appreciated that in the embodiment, the depth $X_a$ of the trench 13, the depth $X_b$ of the P-type base region 21, the depth $X_c$ of the heavily doped P-type region 23 and the thickness $t_{OX}$ of the gate insulating film 24 can be determined to have values changing depending on the performance required for the vertical MOS transistor 1. Additionally, the resistivity (or dopant concentration) of the substrate 11 and the epitaxial layer 12, the dopant concentration of the P-type base region 21 and the heavily doped P-type region 23, ion implantation and heat treatment conditions employed to form the aforementioned components can be determined depending on the desired performance, the manufacturing method, etc., of the transistor.

As described so far, the vertical MOS transistor of the invention can be formed to have a simple structure and is able to further increase its blocking voltage $BV_{DS}$ in an off-state without increasing the on-resistance of the transistor.

What is claimed is:

1. A vertical field effect transistor comprising:

a drain region including a semiconductor layer of a first conductivity type;

a base region of a second conductivity type formed on said drain region and located adjacent to said drain region;

a source region of a first conductivity type located within said base region and formed in a surface portion of said base region;

a trench penetrating said base region and said source region to reach a part of said drain region, and extending in longitudinal and lateral directions in order to divide said base region and said source region into individual base regions and individual source regions;

a gate insulating film formed on a surface of said trench;

a gate electrode formed within said trench while interposing said gate insulating film between said gate electrode and said surface of said trench; and a base contact region located at a central portion of a region surrounded by said trench and apart from said source region, and formed deeper said base region, and further, having a higher dopant concentration than said base region, wherein said transistor being further constructed such that when assuming a distance between a bottom and a top of said trench in a depth direction of said trench, a distance between a bottom and a top of said base region in a depth direction of said base region, and a distance between a bottom and a top of said base contact region in a depth direction of said base contact region are $X_a$, $X_b$ and $X_c$, respectively, said trench, said base region and said base contact region are formed so as to satisfy following mathematical relationships:

$$X_b < X_a$$

$$X_b < X_c < (2 \times X_a - X_b).$$

2. The vertical field effect transistor according to claim 1, wherein said distance $X_c$ representing a depth of said base contact region is the same as said distance $X_a$ representing a depth of said trench.

3. The vertical field effect transistor according to claim 1, wherein when assuming spacing between said trench and said base contact region is $L_{td}$, said trench and said base contact region is $L_{td}$ are formed so as to satisfy a following mathematical relationship:

$$L_{td} \leq 2 \times (X_a - X_b).$$

4. The vertical field effect transistor according to claim 1, wherein said drain region includes a semiconductor substrate of a first conductivity type, an epitaxial layer deposited on a principle surface of said semiconductor substrate of a first conductivity type and doped to a lower dopant concentration than said semiconductor substrate, and said trench, said base region and said base contact region are formed in said epitaxial layer.

5. The vertical field effect transistor according to claim 1, wherein said first conductivity type is N-type and said second conductivity type is P-type.

6. The vertical field effect transistor according to claim 1, wherein said first conductivity type is P-type and said second conductivity type is N-type.

* * * * *